(12) United States Patent
Uemura et al.

(10) Patent No.: US 8,441,294 B2
(45) Date of Patent: May 14, 2013

(54) DATA HOLDING CIRCUIT

(75) Inventors: Taiki Uemura, Kawasaki (JP);
Yoshiharu Tosaka, Kawasaki (JP)

(73) Assignee: Fujitsu Semiconductor Limited,
Yokohama (JP)

( * ) Notice: Subject to any disclaimer, the term of this patent is extended or adjusted under 35 U.S.C. 154(b) by 177 days.

(21) Appl. No.: 13/037,980

(22) Filed: Mar. 1, 2011

(65) Prior Publication Data

US 2011/0148495 A1 Jun. 23, 2011

Related U.S. Application Data

(62) Division of application No. 12/270,426, filed on Nov. 13, 2008, now abandoned.

(30) Foreign Application Priority Data

Nov. 20, 2007 (JP) ................................ 2007-300552

(51) Int. Cl.
*H03K 3/00* (2006.01)

(52) U.S. Cl.
USPC ............. 327/199; 327/34; 327/208; 327/213; 327/218

(58) Field of Classification Search .................... 327/34, 327/199, 202, 203, 208, 210–213, 215, 218, 327/219, 225
See application file for complete search history.

(56) References Cited

U.S. PATENT DOCUMENTS

| 4,760,279 A | 7/1988 | Saito et al. |
| 2009/0102532 A1* | 4/2009 | Eimitsu et al. ................. 327/208 |
| 2009/0128196 A1* | 5/2009 | Uemura et al. .................. 327/91 |

FOREIGN PATENT DOCUMENTS

| JP | 63-10913 | 1/1988 |
| JP | 63-169118 | 7/1988 |
| JP | 03-185921 A | 8/1991 |
| JP | 2004-336123 | 11/2004 |
| JP | 2004-336123 A | 11/2004 |

OTHER PUBLICATIONS

Office action from Japanese Patent Application JP 2007-300552 dated Feb. 14, 2012.

* cited by examiner

*Primary Examiner* — Long Nguyen
(74) *Attorney, Agent, or Firm* — Arent Fox LLP

(57) ABSTRACT

A data holding circuit including a first input terminal through which data is inputted; at least one delay element for delaying the data inputted through the first input terminal; and a first element for holding data, wherein, when the data inputted through the first input terminal and the data delayed by the delay element are equal to each other, the first element holds data corresponding to the data inputted through the first input terminal and wherein, when the data inputted through the first input terminal and the data delayed by the delay element are different from each other, the first element continues to hold the data presently held by the first element.

5 Claims, 19 Drawing Sheets

| IN | D1 | OUT |
|----|----|-----|
| 0  | 0  | 1   |
| 1  | 1  | 0   |
| 0  | 1  | HOLD PRECEDING DATA |
| 1  | 0  | HOLD PRECEDING DATA |

| A | B | C | Q |
|---|---|---|---|
| 0 | 0 | 0 | 0 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 1 | 0 | 1 |
| 1 | 1 | 1 | 1 |

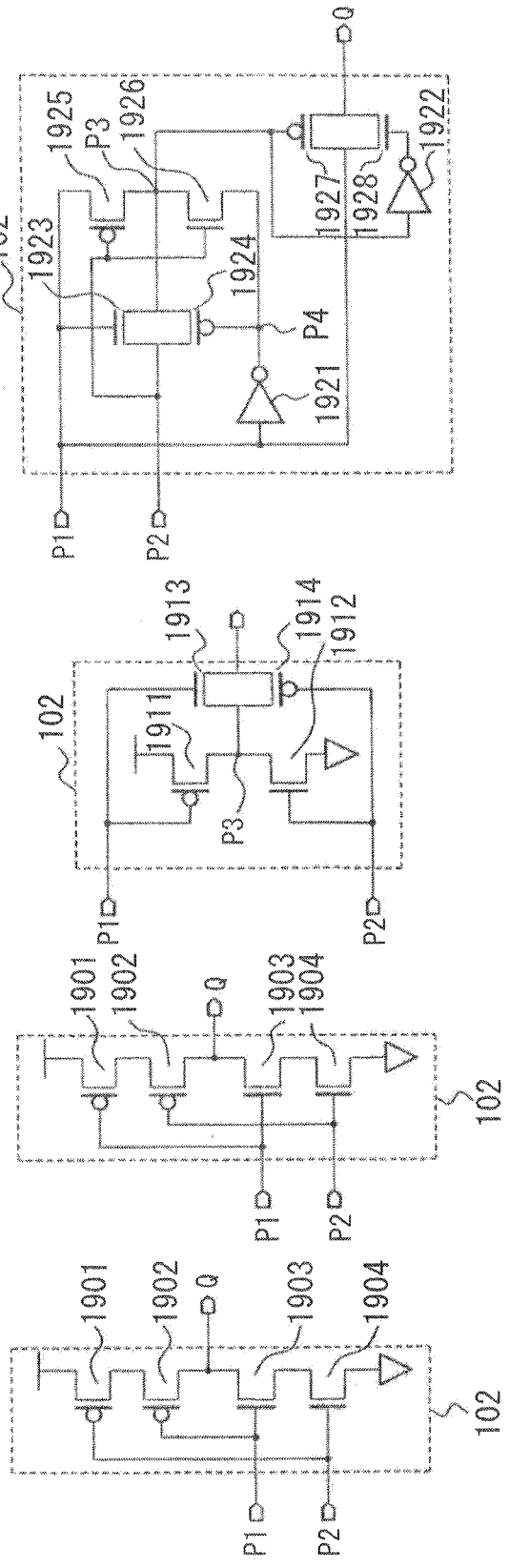

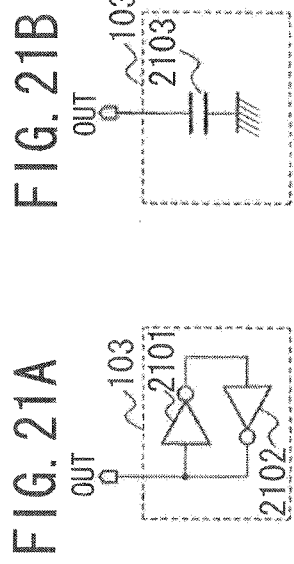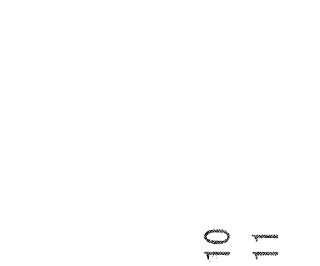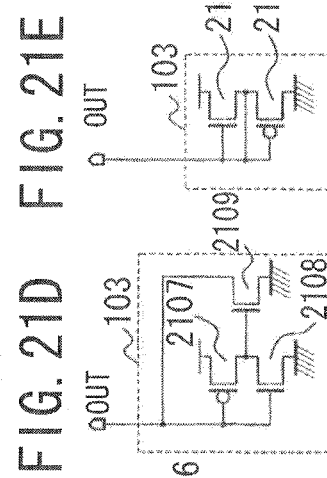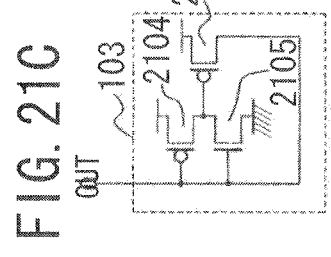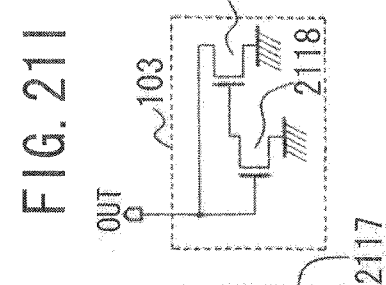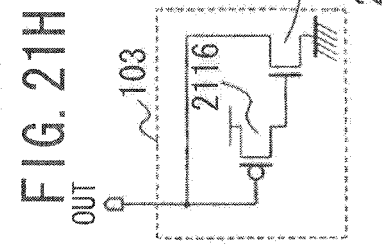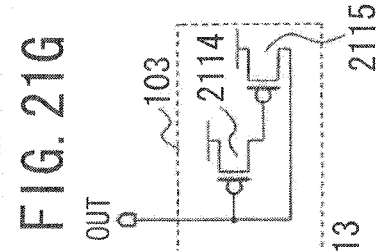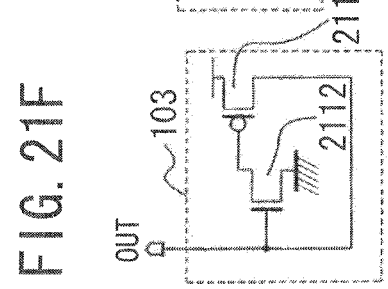

DATA HOLDING CIRCUIT

CROSS-REFERENCE TO RELATED APPLICATION

This application is a Divisional Application of U.S. patent application Ser. No. 12/270,426, filed Nov. 13, 2008, now pending, which claims the benefit of priority of Japanese Patent Application No. 2007-300552 filed Nov. 20, 2007. The disclosures of the prior applications are hereby incorporated by reference herein in their entirety.

BACKGROUND

1. Field

The present invention relates to a data holding circuit.

2. Description of the Related Art

The term "soft error" indicates an operation-restorable transient malfunction occurring at random in a semiconductor chip, which is different from a hard error that indicates permanent breakdown of a particular part of a circuit. Soft errors are caused when neutron rays generated as secondary cosmic rays, alpha rays generated from LSI materials, and the like are incident on an LSI.

Currently, there are various countermeasure methods for dealing with soft errors. The most effective and generally employed countermeasure method is adoption of such a circuit configuration that generated errors do not affect the system. For example, in an ECC (Error Correction Code) circuit, error correction can be performed relatively easily. Nevertheless, these countermeasure methods cause an increase in the chip area inapplicable to logic circuits. Thus, when the soft error rate increases with an increasing integration ratio, the problem of soft errors is expected to become more serious.

A soft error avoiding technique for a general logic circuit is described in Japanese Laid-open Patent Publication No. 2004-336123. In this method, a plurality of logic circuits are prepared so that soft errors are avoided by a majority decision logic. Nevertheless, this particular method requires several times the chip area.

Japanese Laid-open Patent Publication No. Hei 03-185921 describes a semiconductor integrated circuit provided with an output buffer in which two signals corresponding to data applied from a data storing means onto an input are applied onto individual control terminals of two pieces of first and second switching means connected in series between two power supply terminals and in which one of the switching means pieces is turned ON and the other is turned OFF so that a signal corresponding to the data is outputted to outside from a connecting middle point of the two switching means pieces, wherein the semiconductor integrated circuit is characterized by comprising a penetration current prevention circuit in which at the time of level change in the data, a control signal for bringing the two switching means pieces into an OFF state is first applied onto the individual control terminals of the two switching means pieces, and then a control signal for obtaining an output corresponding to the data is applied onto the individual control terminals.

SUMMARY

According to an aspect of an embodiment of the present invention, a data holding circuit includes a first input terminal through which data is inputted; one or more delay elements that delay the data inputted through the first input terminal; and a first element that, when the data inputted through the first input terminal and the data delayed by the delay element are equal to each other, holds data corresponding to the data inputted through the first input terminal and that, when the data inputted through the first input terminal and the data delayed by the delay element are different from each other, continues to hold the data presently held by the first element.

BRIEF DESCRIPTION OF THE DRAWINGS

FIGS. 19A to 19D are circuit diagrams each showing an exemplary configuration of a comparison circuit.

FIGS. 21A to 21I are circuit diagrams each showing an exemplary configuration of a data holding element.

DESCRIPTION OF THE PREFERRED EMBODIMENTS

First Embodiment

Figure 1:
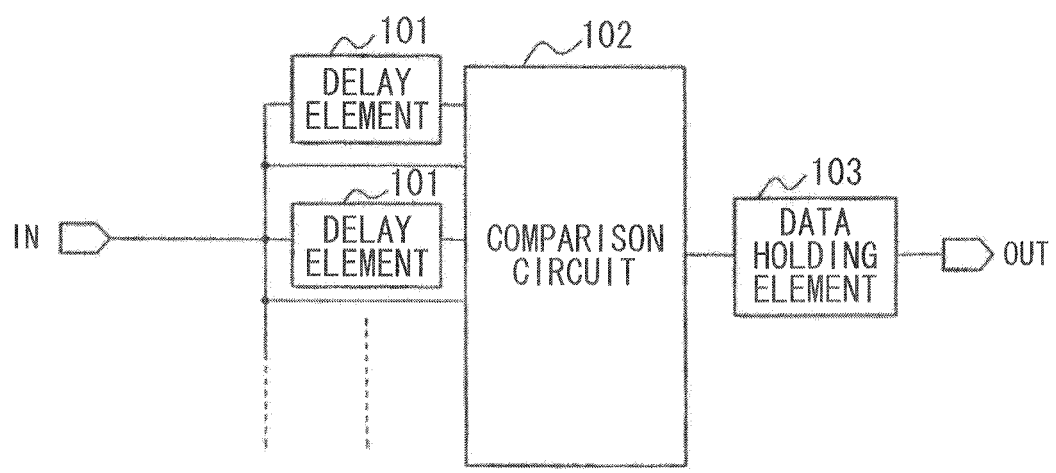
FIG. 1 is a block diagram showing an exemplary configuration of a data holding circuit according to a first embodiment of the present invention.

FIG. 1 is a block diagram showing an exemplary configuration of a data holding circuit according to a first embodiment of the present invention. An input terminal IN is connected to a comparison circuit 102 directly or via a delay element 101. Each of a plurality of delay elements 101 delays the data provided on the input terminal IN by a mutually different time delay and then outputs the delayed data to the comparison circuit 102. The comparison circuit 102 compares the inputted data, and then outputs data corresponding to the comparison result, to a data holding element 103. As a result, the comparison circuit 102 can output data in which a noise caused by a soft error has been removed. Its details are described later with reference to FIG. 2. The data holding element 103 holds the data outputted from the comparison circuit 102, and outputs the held data through the output terminal OUT.

Figure 2:
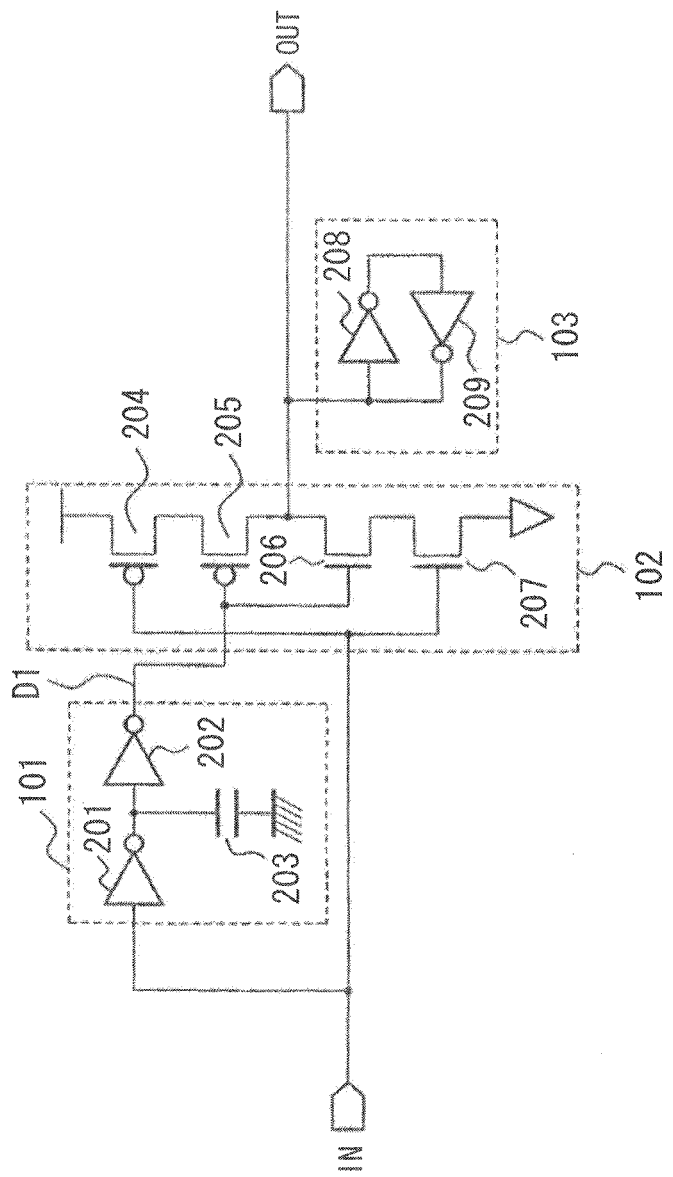
FIG. 2 is a circuit diagram showing an example of a detailed configuration of a data holding circuit in FIG. 1.
Figures 3, 4:
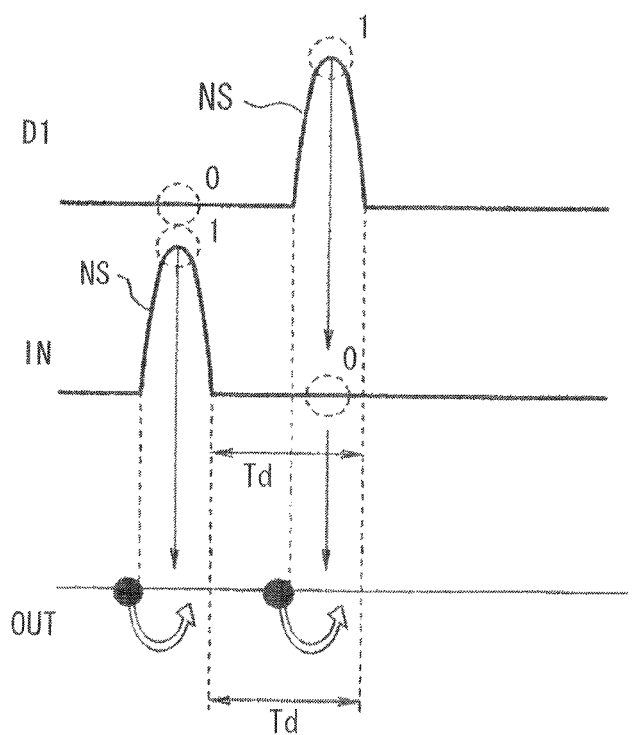
FIG. 3 is a diagram showing a truth value table of a comparison circuit.
FIG. 4 is a timing chart showing an exemplary operation of a data holding circuit of FIG. 2.

FIG. 2 is a circuit diagram showing an example of a detailed configuration of the data holding circuit in FIG. 1. FIG. 4 is a timing chart showing exemplary operation of the data holding circuit in FIG. 2. In the following description, MOS field effect transistors are simply referred to as transistors.

The delay element 101 has inverters 201 and 202 and a capacitor 203. In the inverter 201, the input terminal is connected to the input terminal IN, while the output terminal is connected to the input terminal of the inverter 202. The output terminal of the inverter 202 is connected to a node D1. The capacitor 203 is connected between the output terminal of the inverter 201 and a reference potential (ground potential) The inverters 201 and 202 output data obtained by inverting the individual input data. As shown in FIG. 4, the delay element 101 outputs, to the node D1, data obtained by delaying the data provided on the input terminal IN by a time delay Td.

The comparison circuit 102 has transistors 204 to 207. In the p-channel transistor 204, the source is connected to a power supply potential, while the gate is connected to the input terminal IN, and while the drain is connected to the source of the p-channel transistor 205. In the p-channel transistor 205, the gate is connected to the node D1, while the drain is connected to the output terminal OUT. In the n-channel transistor 206, the drain is connected to the output terminal OUT, while the gate is connected to the node D1, and while the source is connected to the drain of the n-channel transistor 207. In the n-channel transistor 207, the gate is connected to the input terminal IN, while the source is connected to the reference potential.

The data holding element 103 has inverters 208 and 209. The input terminal of the inverter 208 is connected to the output terminal of the inverter 209 and the output terminal OUT. The output terminal of the inverter 208 is connected to the input terminal of the inverter 209. The inverters 208 and 209 output data obtained by inverting the individual input data. As a result, the data holding element 103 can hold the data provided on the output terminal OUT.

FIG. 3 is a diagram showing a truth value table of the comparison circuit 102. FIG. 4 shows the relation of the data on the input terminal IN, the node D1, and the output terminal OUT. In the data, value "0" indicates a low level, while value "1" indicates a high level.

When the data on the input terminal IN is "0" and the data on the node D1 is "0", the transistors 204 and 205 go ON and the transistors 206 and 207 go OFF so that the data on the output terminal OUT becomes "1".

When the data on the input terminal IN is "1" and the data on the node D1 is "1", the transistors 204 and 205 go OFF and the transistors 206 and 207 go ON so that the data on the output terminal OUT becomes "0".

Further, when the data on the input terminal IN is "0" and the data on the node D1 is "1", the transistors 204 and 206 go ON and the transistors 205 and 207 go OFF so that the output terminal of the comparison circuit 102 goes into a high impedance state. The output terminal OUT holds the preceding data by means of the data holding element 103. As shown in FIG. 4, even when a noise NS is generated on the node D1 by a soft error, as long as the data on the input terminal IN at that time is "0", the output terminal OUT holds the preceding data so that the soft error noise NS is removed.

Further, when the data on the input terminal IN is "1" and the data on the node D1 is "0", the transistors 205 and 207 go ON and the transistors 204 and 206 go OFF so that the output terminal of the comparison circuit 102 goes into a high impedance state. The output terminal OUT holds the preceding data by means of the data holding element 103. As shown in FIG. 4, even when a noise NS is generated on the input terminal IN by a soft error, as long as the data on the node D1 at that time is "0", the output terminal OUT holds the preceding data so that the soft error noise NS is removed.

As described above, the comparison circuit 102 receives data on the input terminal IN and data obtained by delaying it and provided on the node D1. The output terminal of the comparison circuit 102 is connected to the data holding element 103. The data holding element 103 is constructed from a capacitor or a latch circuit. A case is described below that a transient noise NS is generated by radiations or the like in a circuit at a preceding stage relative to the input terminal IN and that the noise NS reaches the input terminal IN. In this case, by virtue of the delay element 101, the noise NS on the input terminal IN and the noise NS on the node D1 are inputted to the comparison circuit 102 at mutually different timings. As seen from the truth value table of the comparison circuit 102 shown in FIG. 3, when mutually different two input signals are inputted to the two inputs of the comparison circuit 102, the preceding data is held. Thus, the signal change caused by the noise NS does not affect the output of the comparison circuit 102. That is, according to the above-mentioned configuration, a transient noise NS generated at a preceding stage relative to the input terminal IN does not affect the subsequent stage relative to the output terminal OUT. Thus, the influence of soft errors is avoided in the data holding circuit.

Second Embodiment

Figure 5:
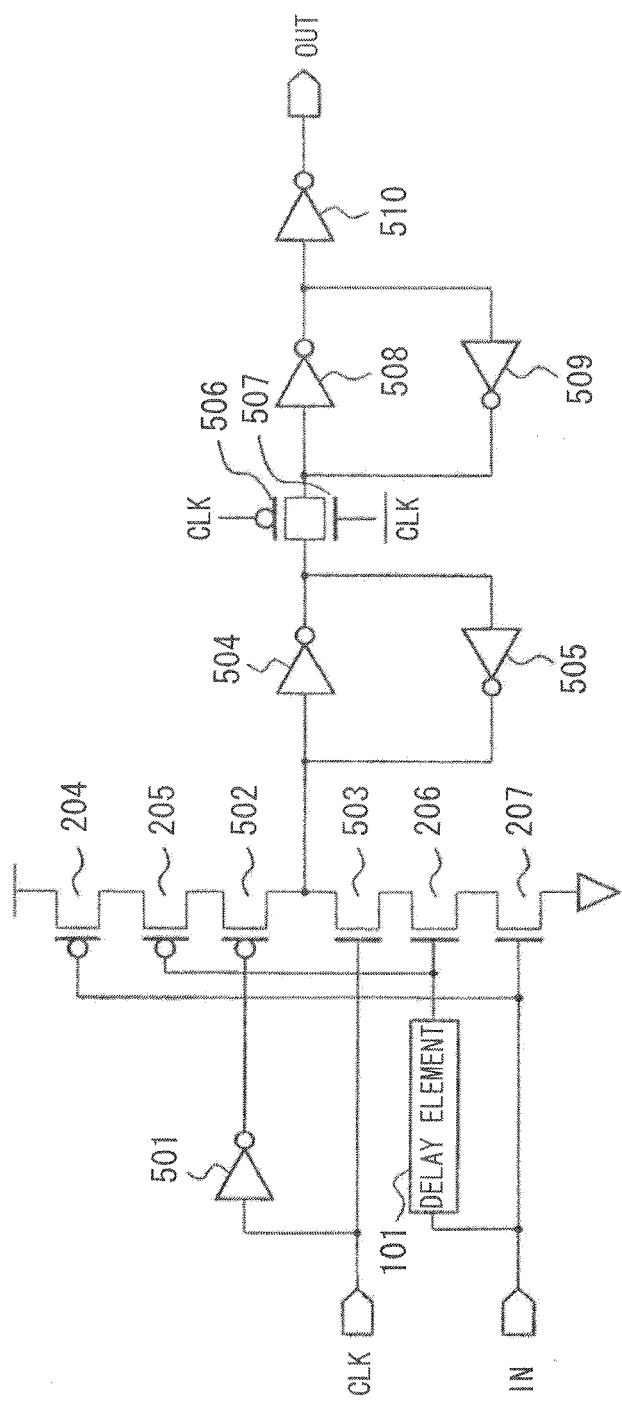
FIG. 5 is a circuit diagram showing an exemplary configuration of a data holding circuit according to a second embodiment of the present invention.

FIG. 5 is a circuit diagram showing an exemplary configuration of a data holding circuit according to a second embodiment of the present invention. The difference of the circuit in FIG. 5 from the circuit in FIG. 2 is described below. An inverter 501 outputs a clock signal obtained by inverting a clock signal on a clock terminal CLK. In the comparison circuit 102, transistors 502 and 503 are provided in addition to the transistors 204 to 207. In the p-channel transistor 502, the source is connected to the drain of the transistor 205, while the gate is connected to the output terminal of the inverter 501, and while the drain is connected to the input terminal of the inverter 504. In the n-channel transistor 503, the drain is connected to the input terminal of the inverter 504, while the gate is connected to the clock terminal CLK, and while the source is connected to the drain of the transistor 205.

The input terminal of the inverter 504 is connected to the output terminal of the inverter 505, while the output terminal of the inverter 504 is connected to the input terminal of the inverter 505. The inverters 504 and 505 output data obtained by inverting the individual input data. The inverters 504 and 505 constitute a first data holding element 103.

In the p-channel transistor 506, the source is connected to the output terminal of the inverter 504, while the gate is connected to the clock terminal CLK, and while the drain is connected to the input terminal of the inverter 508. In the n-channel transistor 507, the drain is connected to the output terminal of the inverter 504, while the gate is connected to the inverted clock terminal /CLK, and while the source is connected to the input terminal of the inverter 508. Clock signals inverted to each other are inputted to the clock terminal CLK and the inverted clock terminal /CLK. The transistors 506 and 507 constitutes a transfer gate.

The input terminal of the inverter 508 is connected to the output terminal of the inverter 509, while the output terminal of the inverter 508 is connected to the input terminal of the inverter 509. The inverters 508 and 509 output data obtained by inverting the individual input data. The inverters 508 and 509 constitute a second data holding element.

In the inverter 510, the input terminal is connected to the output terminal of the inverter 508, while the output terminal is connected to the output terminal OUT. As shown in the truth value table of FIG. 3, when the data on the input terminal IN and the data on the node D1 are equal to each other, the comparison circuit 102 composed of the transistors 204 to 207, 502, and 503 operates as an inverter, and hence outputs data obtained by inverting the data on the input terminal IN. Thus, in this case, the data on the output terminal OUT has the relation of positive logic to the data on the input terminal IN.

A clock signal is inputted to the clock terminal CLK. When the clock terminal CLK goes into a high level, the transistors 502 and 503 go ON and the transistors 506 and 507 go OFF. As a result, inverted data to the data inputted through the input terminal IN is held in the data holding element composed of the inverters 504 and 505. This situation is a so-called data writing mode.

Further, when the clock terminal CLK goes into a low level, the transistors 502 and 503 go OFF and the transistors 506 and 507 go ON. As a result, the output terminal of the comparison circuit 102 composed of the transistors 204 to 207, 502, and 503 goes into a high impedance state. Further, the data holding element composed of the inverters 508 and 509 holds the output data of the data holding element composed of the inverters 504 and 505. This situation is a so-called data holding mode.

Third Embodiment

Figure 6:
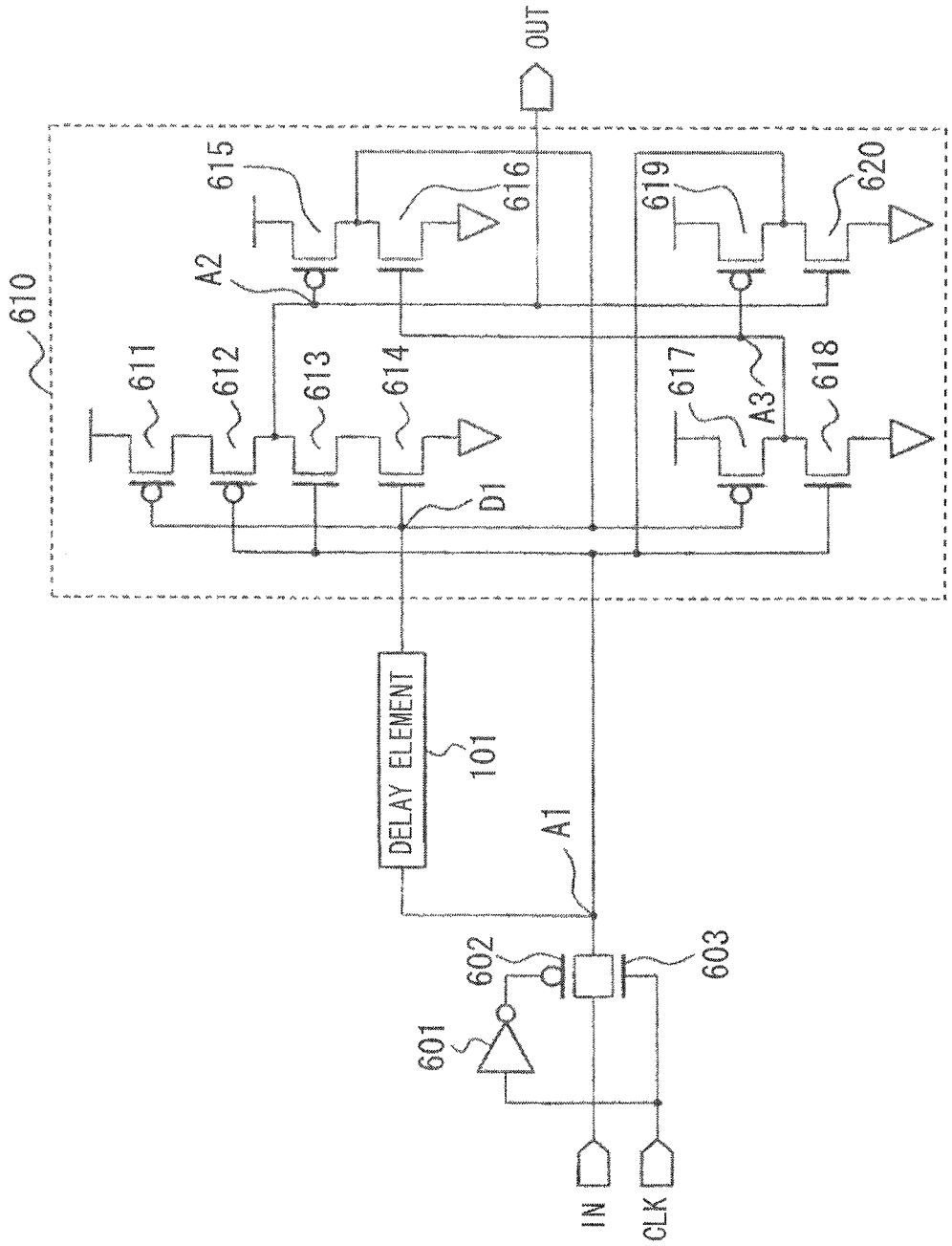
FIG. 6 is a circuit diagram showing an exemplary configuration of a data holding circuit according to a third embodiment of the present invention.

FIG. 6 is a circuit diagram showing an exemplary configuration of a data holding circuit according to a third embodiment of the present invention. The input terminal of the inverter 601 is connected to the clock terminal CLK. In the p-channel transistor 602, the source is connected to the input terminal IN, while the gate is connected to the output terminal of the inverter 601, and while the drain is connected to the node A1. In the n-channel transistor 603, the drain is connected to the input terminal IN, while the gate is connected to the clock terminal CLK, and while the source is connected to the node A1. The delay element 101 outputs data obtained by delaying the data on the node A1, to the node D1. The comparison and data holding element 610 has transistors 611 to 620 and is a circuit in which the comparison circuit 102 and the data holding element 103 in FIG. 1 are integrated.

In the p-channel transistor 611, the source is connected to the power supply potential, while the gate is connected to the node D1, and while the drain is connected to the source of the p-channel transistor 612. In the p-channel transistor 612, the gate is connected to the node A1, while the drain is connected to the node A2. In the n-channel transistor 613, the drain is connected to the node A2, while the gate is connected to the node A1, and while the source is connected to the drain of the n-channel transistor 614. In the n-channel transistor 614, the gate is connected to the node D1, while the source is connected to the reference potential.

In the p-channel transistor 615, the source is connected to the power supply potential, while the gate is connected to the node A2, and while the drain is connected to the node D1. In the n-channel transistor 616, the drain is connected to the node D1, while the gate is connected to the node A3, and while the source is connected to the reference potential.

In the p-channel transistor 617, the source is connected to the power supply potential, while the gate is connected to the node D1, and while the drain is connected to the node A3. In the n-channel transistor 618, the drain is connected to the node A3, while the gate is connected to the node A1, and while the source is connected to the reference potential.

In the p-channel transistor 619, the source is connected to the power supply potential, while the gate is connected to the node A3, and while the drain is connected to the node A1. In the n-channel transistor 620, the drain is connected to the node A1, while the gate is connected to the node A2, and while the source is connected to the reference potential.

The comparison and data holding element 610 has a truth value table for input/output data which is the same as that of FIG. 3, and has the functions of both the comparison circuit 102 and the data holding element 103 in FIG. 2. When the clock terminal CLK goes into a high level, the transistors 602 and 603 go ON so that the input terminal IN is connected to the node A1. That is, the circuit goes into a data writing mode. On the contrary, when the clock terminal CLK goes into a low level, the transistors 602 and 603 go OFF so that the input terminal IN is disconnected from the node A1. That is, the circuit goes into a data holding mode. The other points in the present embodiment are similar to those of the first embodiment.

Fourth Embodiment

Figure 7:
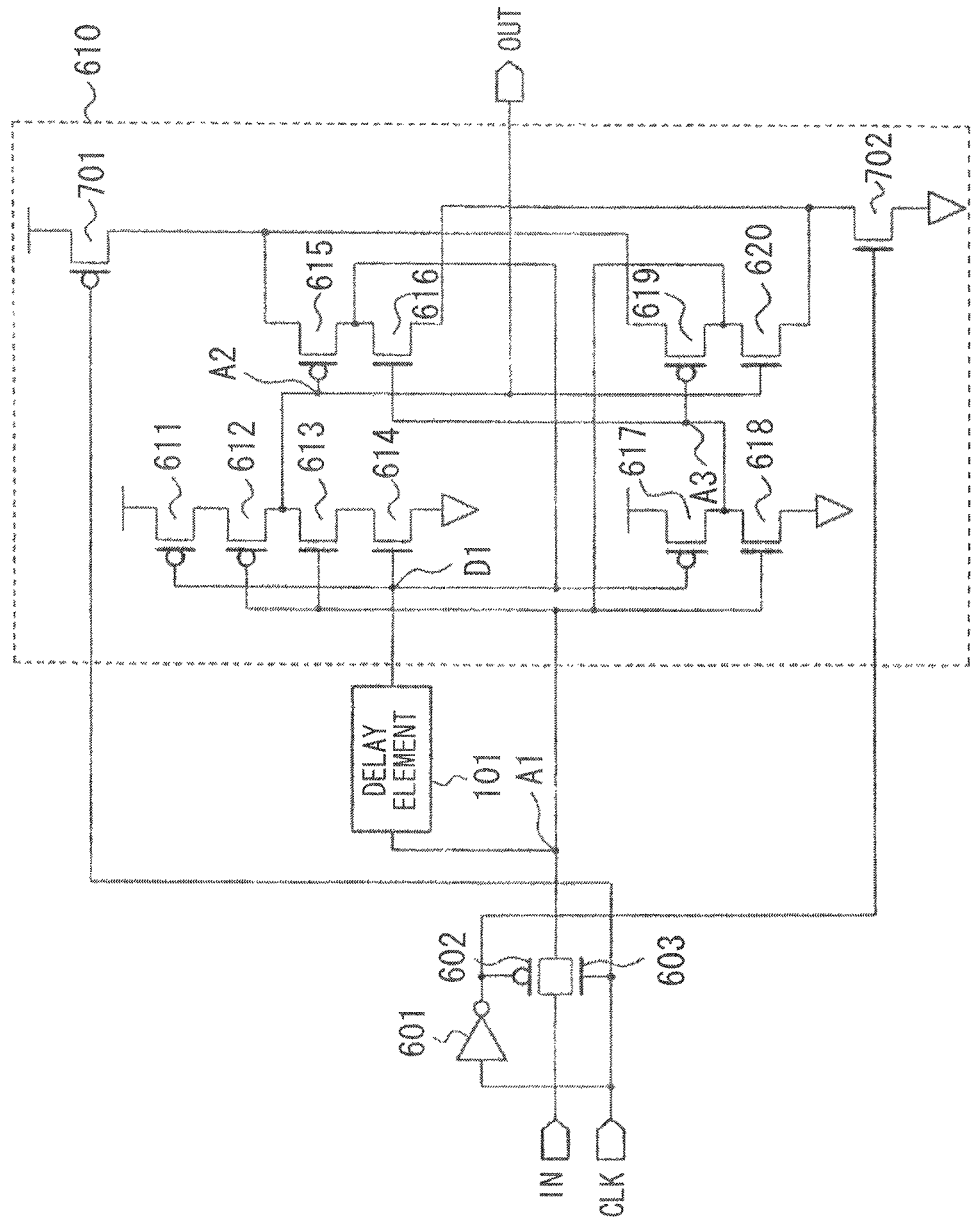
FIG. 7 is a circuit diagram showing an exemplary configuration of a data holding circuit according to a fourth embodiment of the present invention.

FIG. 7 is a circuit diagram showing an exemplary configuration of a data holding circuit according to a fourth embodiment of the present invention. The circuit in FIG. 7 is obtained by adding transistors 701 and 702 to the circuit in FIG. 6. The difference of the circuit in FIG. 7 from the circuit in FIG. 6 is described below. In the p-channel transistor 701, the source is connected to the power supply potential, while the gate is connected to the clock terminal CLK, and while the drain is connected to the sources of the transistors 615 and 619. In the n-channel transistor 702, the drain is connected to the sources of the transistors 616 and 620, while the gate is connected to the output terminal of the inverter 601, and while the source is connected to the reference potential. When the clock terminal CLK goes into a high level, the circuit goes into a data writing mode. That is, the transistors 701 and 702 go OFF so that the data holding function of the circuit 610 goes OFF. On the contrary, when the clock terminal CLK goes into a low level, the circuit goes into a data holding mode. That is, the transistors 701 and 702 go ON so that the data holding function of the circuit 610 goes ON.

Fifth Embodiment

Figure 8:
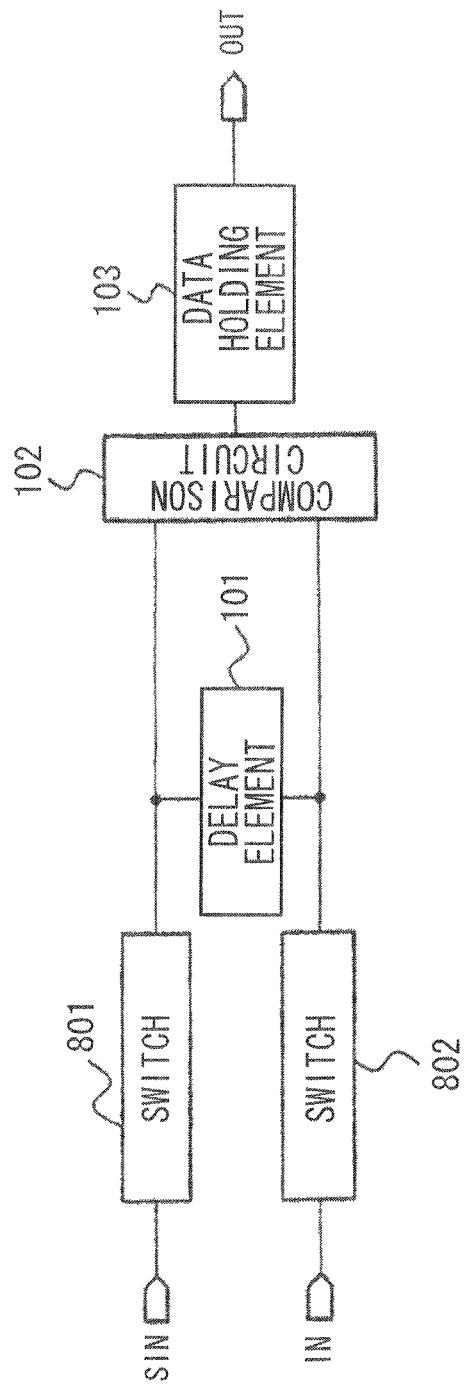
FIG. 8 is a block diagram showing an exemplary configuration of a data holding circuit according to a fifth embodiment of the present invention.

FIG. 8 is a block diagram showing an exemplary configuration of a data holding circuit according to a fifth embodiment of the present invention. The input terminal IN is a data input terminal at the time of normal operation. The scan input terminal SIN is a scan data input terminal at the time of scan test. In the switch 801, one end is connected to the scan input terminal SIN, while the other end is connected to the comparison circuit 102 and the delay element 101. In the switch 802, one end is connected to the input terminal IN, while the other end is connected to the comparison circuit 102 and the delay element 101. The data holding element 103 is connected between the comparison circuit 102 and the output terminal OUT.

When the switch 801 goes ON, the switch 802 goes OFF so that the output signal of the switch 801 and a signal generated when this output signal passes through the delay element 101 are inputted to the comparison circuit 102. That is, the scan input terminal SIN serves as an effective terminal so that a circuit similar to that of FIG. 2 is formed.

On the contrary, when the switch 802 goes ON, the switch 801 goes OFF so that the output signal of the switch 802 and a signal generated when this output signal passes through the delay element 101 are inputted to the comparison circuit 102. That is, the input terminal IN serves as an effective terminal so that a circuit similar to that of FIG. 2 is formed.

Sixth Embodiment

Figure 9:
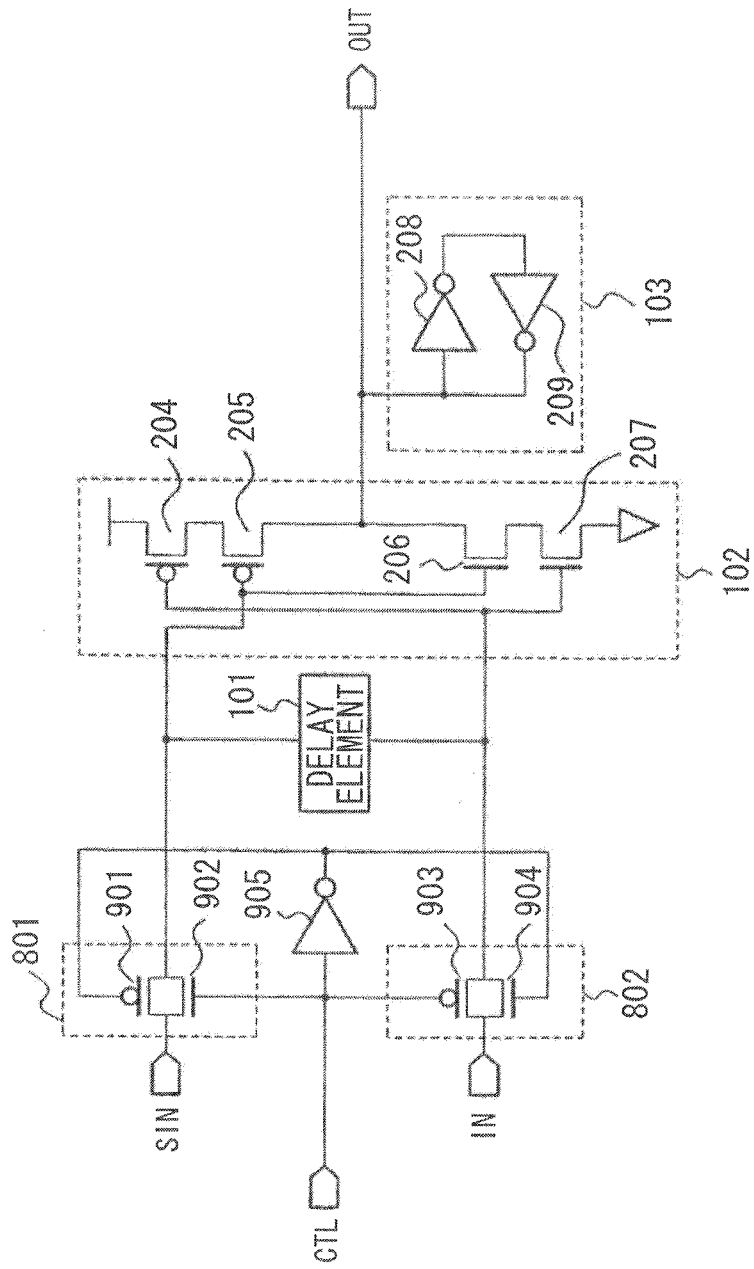
FIG. 9 is a circuit diagram showing an exemplary configuration of a data holding circuit according to a sixth embodiment of the present invention.

FIG. 9 is a circuit diagram showing an exemplary configuration of a data holding circuit according to a sixth embodiment, and shows a detailed example of the circuit in FIG. 8. The inverter 905 outputs a signal obtained by inverting the scan control signal on the scan control terminal CTL.

The switch 801 has transistors 901 and 902. In the p-channel transistor 901, the gate is connected to the output terminal of the inverter 905, while the source is connected to the scan input terminal SIN, and while the drain is connected to the delay element 101 and the gates of the transistors 205 and 206. In the n-channel transistor 902, the gate is connected to the scan control terminal CTL, while the drain is connected to the scan input terminal SIN, and while the source is connected to the delay element 101 and the gates of the transistors 205 and 206.

The switch 802 has transistors 903 and 904. In the p-channel transistor 903, the gate is connected to the scan control terminal CTL, while the source is connected to the input terminal IN, and while the drain is connected to the delay element 101 and the gates of the transistors 204 and 207. In the n-channel transistor 904, the gate is connected to the output terminal of the inverter 905, while the drain is connected to the input terminal IN, and while the source is connected to the delay element 101 and the gates of the transistors 204 and 207.

The comparison circuit 102 has transistors 204 to 207. In the p-channel transistor 204, the source is connected to the power supply potential, while the drain is connected to the source of the p-channel transistor 205. The drain of the p-channel transistor 205 is connected to the output terminal OUT. In the n-channel transistor 206, the drain is connected to the output terminal OUT, while the source is connected to the drain of the n-channel transistor 207. The source of the n-channel transistor 207 is connected to the reference potential.

The data holding element 103 has inverters 208 and 209. In the inverter 208, the input terminal is connected to the output terminal OUT and the output terminal of the inverter 209, while the output terminal is connected to the input terminal of the inverter 209.

When the scan control terminal CTL goes into a high level, the circuit goes into a scan test mode. That is, the switch 801 goes ON and the switch 802 goes OFF so that the output signal of the switch 801 and a signal generated when this output signal passes through the delay element 101 are inputted to the comparison circuit 102. That is, the scan input terminal SIN serves as an effective terminal so that a circuit similar to that of FIG. 2 is formed.

On the contrary, when the scan control terminal CTL goes into a low level, the circuit goes into a normal operation mode. That is, the switch 802 goes ON and the switch 801 goes OFF so that the output signal of the switch 802 and a signal generated when this output signal passes through the delay element 101 are inputted to the comparison circuit 102. That is, the input terminal IN serves as an effective terminal so that a circuit similar to that in FIG. 2 is formed.

Seventh Embodiment

Figure 10:
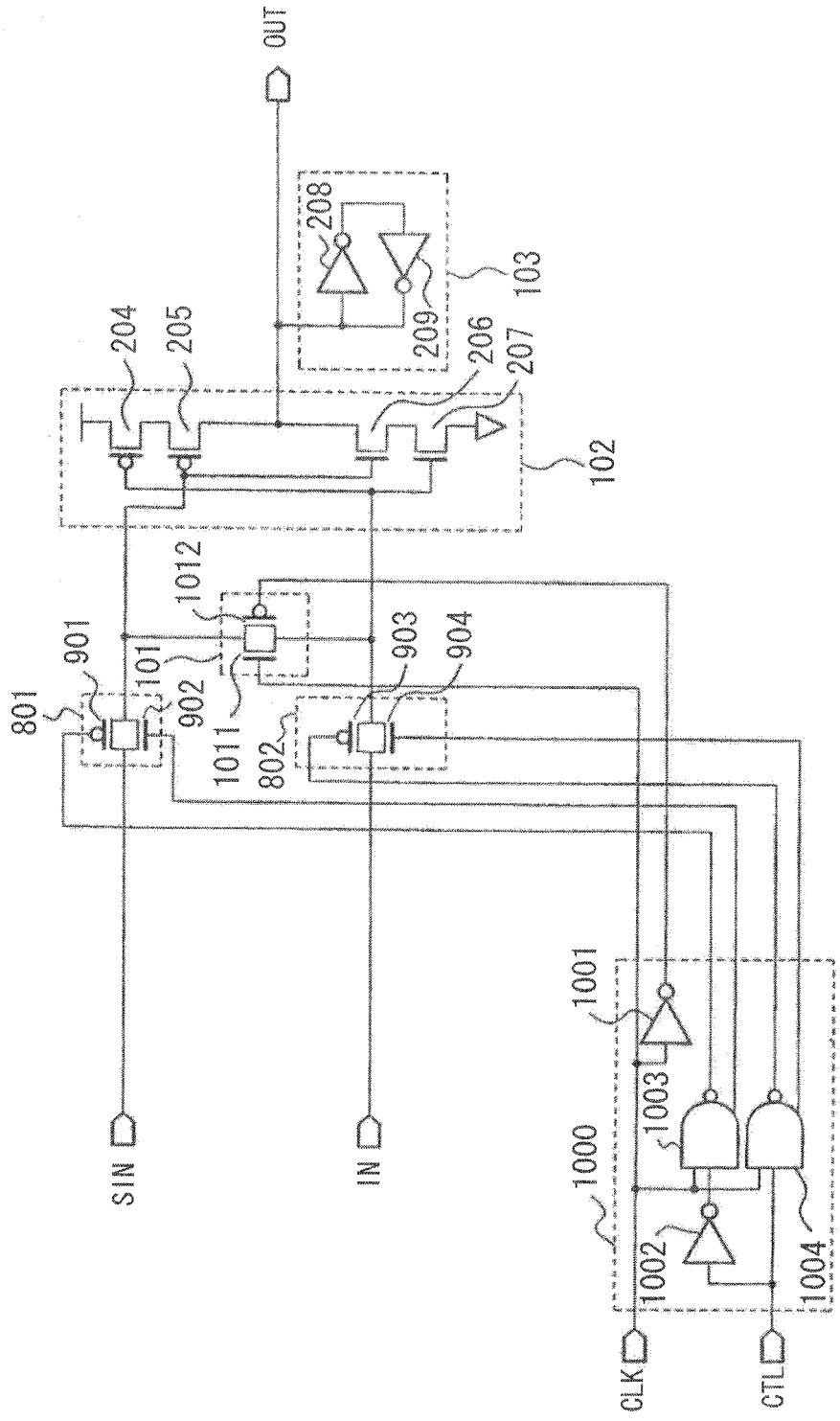
FIG. 10 is a circuit diagram showing an exemplary configuration of a data holding circuit according to a seventh embodiment of the present invention.

FIG. 10 is a circuit diagram showing an exemplary configuration of a data holding circuit according to a seventh embodiment of the present invention. In the present embodiment, a clock terminal CLK is added to the circuit according to the sixth embodiment. The difference of the circuit in FIG. 10 from the circuit in FIG. 9 is described below. The control circuit 1000 has inverters 1001 and 1002 and logic product (AND) circuits 1003 and 1004. The inverter 1001 outputs a signal obtained by inverting the clock signal on the clock terminal CLK. The inverter 1002 outputs a signal obtained by inverting the scan control signal on the scan control terminal CTL. The AND circuit 1003 outputs a positive logic product signal and a negative logic product signal obtained from the clock signal on the clock terminal CLK and the output signal of the inverter 1002. The AND circuit 1004 outputs a positive logic product signal and a negative logic product signal obtained from the clock signal on the clock terminal CLK and the scan control signal on the scan control terminal CTL.

The negative logic product signal of the AND circuit 1003 is inputted to the gate of transistor 901. The positive logic product signal of the AND circuit 1003 is inputted to the gate of transistor 902. The negative logic product signal of the AND circuit 1004 is inputted to the gate of transistor 903. The positive logic product signal of the AND circuit 1004 is inputted to the gate of transistor 904.

The delay element 101 has transistors 1011 and 1012. In the n-channel transistor 1011, the drain is connected to the switch 801, while the gate is connected to the clock terminal CLK, and while the source is connected to the switch 802. In the p-channel transistor 1012, the source is connected to the switch 801, while the gate is connected to the output terminal of the inverter 1001, and while the drain is connected to the switch 802. The time delay in the delay element 101 can be adjusted by adjusting the channel widths of the transistors 1011 and 1012. When the clock signal on the clock terminal CLK is at a high level, the transistors 1011 and 1012 go ON so that the delay element 101 outputs a signal obtained by delaying the input signal. When the clock signal on the clock terminal CLK is at a low level, the transistors 1011 and 1012 go OFF so that the delay element 101 does not operate.

Eighth Embodiment

Figure 11:
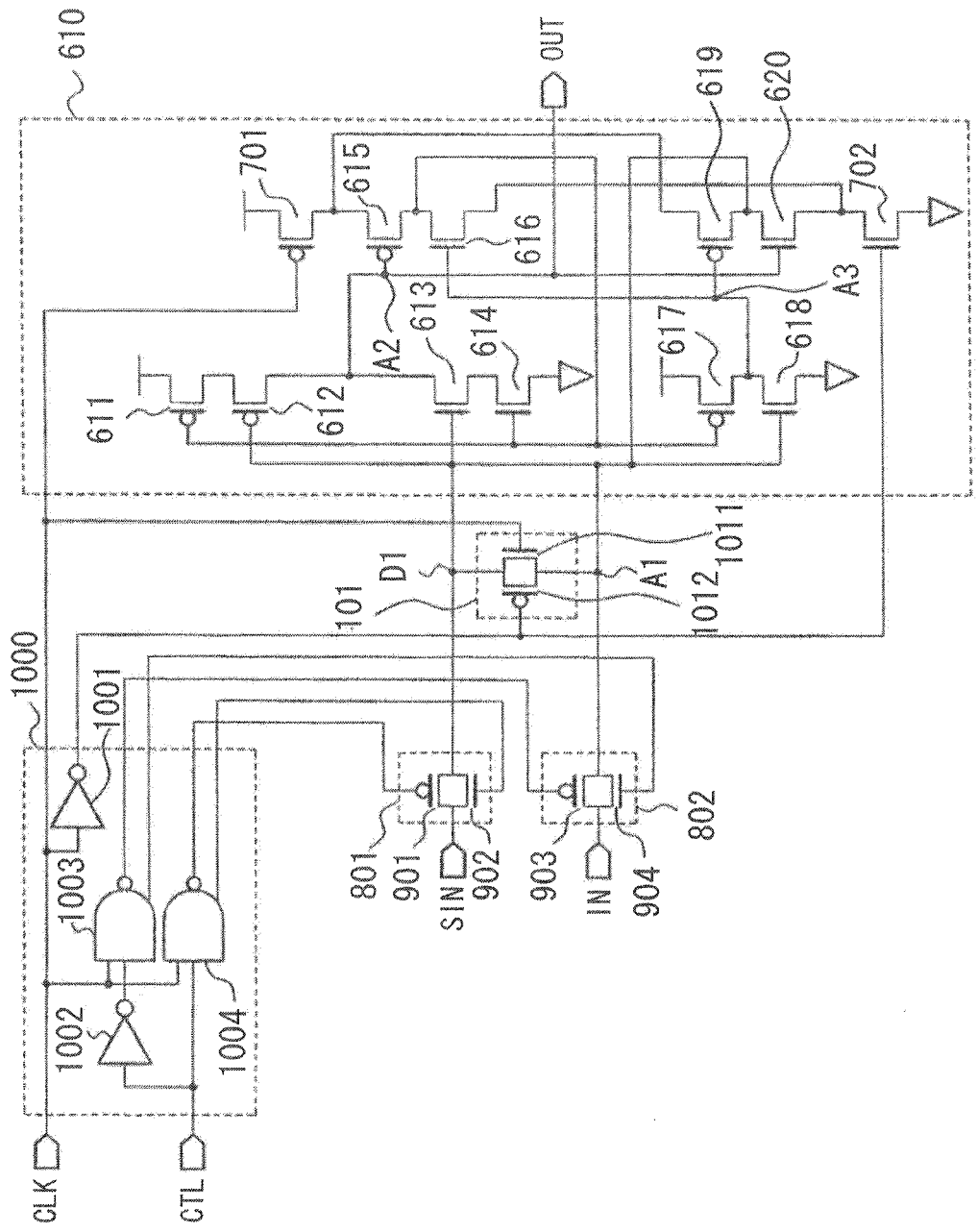
FIG. 11 is a circuit diagram showing an exemplary configuration of a data holding circuit according to an eighth embodiment of the present invention.

FIG. 11 is a circuit diagram showing an exemplary configuration of a data holding circuit according to an eighth embodiment. The circuit in FIG. 11 is obtained when in the circuit in FIG. 10, the comparison and data holding element 610 in FIG. 7 is provided in place of the comparison circuit 102 and the data holding element 103. The comparison and data holding element 610 has the functions of both the comparison circuit 102 and the data holding element 103 in FIG. 10. The circuit in FIG. 11 performs operation similar to that of the circuit in FIG. 10.

Ninth Embodiment

Figure 12:
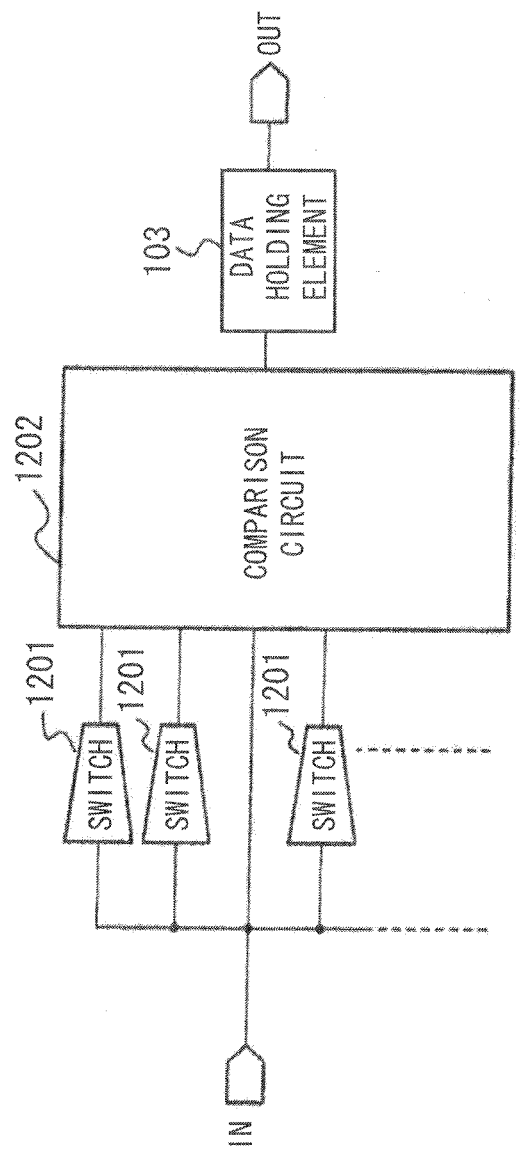
FIG. 12 is a block diagram showing an exemplary configuration of a data holding circuit according to a ninth embodiment of the present invention.

FIG. 12 is a block diagram showing an exemplary configuration of a data holding circuit according to a ninth embodiment of the present invention. The input terminal IN is connected to the comparison circuit 1202 directly or via a switch 1201. The plurality of switches 1201 go from ON to OFF at mutually different timings. The comparison circuit 1202 compares the inputted data, and then outputs data corresponding to the comparison result, to a data holding element 103. As a result, the comparison circuit 1202 can output data in which a noise caused by a soft error has been removed. Its details are described later. The data holding element 103 holds the data outputted from the comparison circuit 1202, and outputs the held data through the output terminal OUT.

Figures 13, 14:
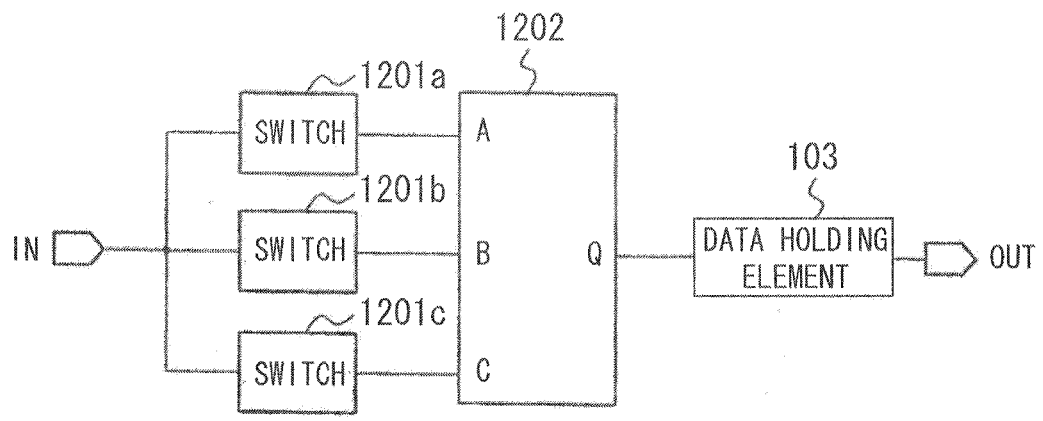
FIG. 13 is a block diagram showing an example in which three switches are provided in a data holding circuit of FIG. 12.
FIG. 14 is a diagram showing a relation of input/output data of a comparison circuit.

FIG. 13 is a block diagram showing an example in which three switches 1201a to 2101c are provided in the data holding circuit in FIG. 12. The switch 1201a is connected between the input terminal IN and the input terminal A of the comparison circuit 1202. The switch 1201b is connected between the input terminal IN and the input terminal B of the comparison circuit 1202. The switch 1201c is connected between the input terminal IN and the input terminal C of the comparison circuit 1202. The comparison circuit 1202 outputs data corresponding to the data on the input terminals A to C, through the output terminal Q.

FIG. 14 is a diagram showing a relation of input/output data of the comparison circuit 1202. The comparison circuit 1202 outputs a large number of data pieces in the data on the three input terminals A to C, through the output terminal Q.

Figure 15:
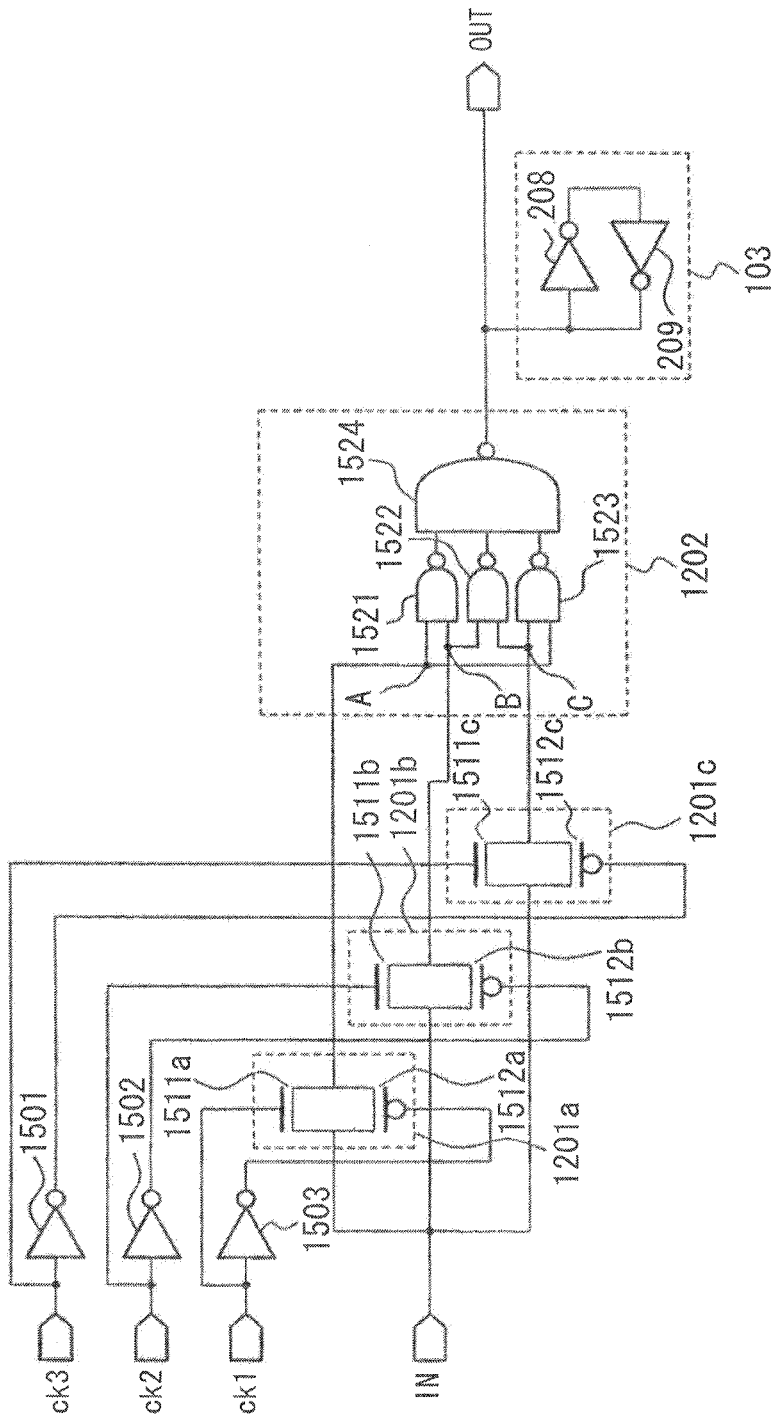
FIG. 15 is a circuit diagram showing an example of a detailed configuration of a data holding circuit of FIG. 13.

FIG. 15 is a circuit diagram showing an example of a detailed configuration of the data holding circuit in FIG. 13. The inverter 1501 outputs a signal obtained by inverting the clock signal on the clock terminal ck3. The inverter 1502 outputs a signal obtained by inverting the clock signal on the clock terminal ck2. The inverter 1503 outputs a signal obtained by inverting the clock signal on the clock terminal ck1.

The switch 1201a has transistors 1511a and 1512a. In the n-channel transistor 1511a, the drain is connected to the input terminal IN, while the gate is connected to the clock terminal ck1, and while the source is connected to the input terminal A of the comparison circuit 1202. In the p-channel transistor 1512a, the source is connected to the input terminal IN, while the gate is connected to the output terminal of the inverter 1503, and while the drain is connected to the input terminal A of the comparison circuit 1202.

The switch 1201b has transistors 1511b and 1512b. In the n-channel transistor 1511b, the drain is connected to the input terminal IN, while the gate is connected to the clock terminal ck2, and while the source is connected to the input terminal B of the comparison circuit 1202. In the p-channel transistor 1512b, the source is connected to the input terminal IN, while the gate is connected to the output terminal of the inverter 1502, and while the drain is connected to the input terminal B of the comparison circuit 1202.

The switch 1201c has transistors 1511c and 1512c. In the n-channel transistor 1511c, the drain is connected to the input terminal IN, while the gate is connected to the clock terminal ck3, and while the source is connected to the input terminal C of the comparison circuit 1202. In the p-channel transistor 1512c, the source is connected to the input terminal IN, while the gate is connected to the output terminal of the inverter 1501, and while the drain is connected to the input terminal C of the comparison circuit 1202.

The comparison circuit 1202 has negated logic product (NAND) circuits 1521 to 1524. The NAND circuit 1521 outputs the NAND signal of the data on the input terminals A and B. The NAND circuit 1522 outputs the NAND signal of the data on the input terminals B and C. The NAND circuit 1523 outputs the NAND signal of the data on the input terminals A and C. The NAND circuit 1524 outputs a NAND signal obtained from the output signals of the NAND circuits 1521 to 1523, through the output terminal OUT.

The data holding element 103 has inverters 208 and 209. In the inverter 208, the input terminal is connected to the output terminal OUT and the output terminal of the inverter 209, while the output terminal is connected to the input terminal of the inverter 209.

Figure 16:
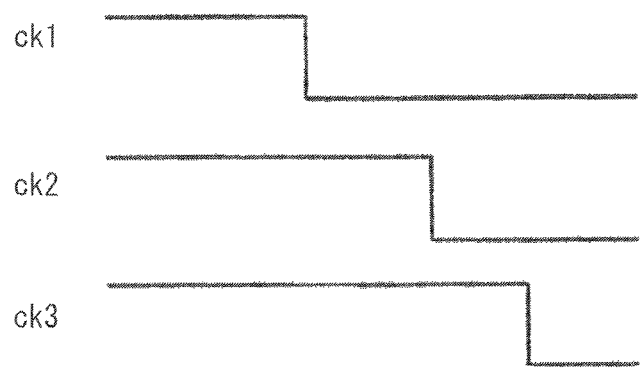
FIG. 16 is a timing chart showing exemplary operation of a data holding circuit of FIG. 15.

FIG. 16 is a timing chart showing exemplary operation of the data holding circuit in FIG. 15. In the beginning of FIG. 16, the three clock terminals ck1 to ck3 are at a high level, and hence the three switches 1201a to 1201c go ON.

Then, the clock terminal ck1 goes from a high level to a low level. Thus, the switch 1201a goes from ON to OFF so that the input terminal A of the comparison circuit 1202 goes into a floating state. Thus, the data on the input terminal IN at the time when the switch 1201a goes from ON to OFF is held.

Then, the clock terminal ck2 goes from a high level to a low level. Thus, the switch 1201b goes from ON to OFF so that the input terminal B of the comparison circuit 1202 goes into a floating state. Thus, the data on the input terminal IN at the time when the switch 1201b goes from ON to OFF is held.

Then, the clock terminal ck3 goes from a high level to a low level. Thus, the switch 1201c goes from ON to OFF so that the input terminal C of the comparison circuit 1202 goes into a floating state. Thus, the data on the input terminal IN at the time when the switch 1201c goes from ON to OFF is held.

For example, even when a noise is generated by a soft error at the falling edge of the signal on the clock terminal ck1, as long as a noise is not generated by a soft error at the falling edges of the signals on the clock terminals ck2 and ck3, the comparison circuit 1202 can output normal data in which the noise is removed.

Similarly, even when a noise is generated by a soft error at the falling edge of the signal on the clock terminal ck2, as long as a noise is not generated by a soft error at the falling edges of the signals on the clock terminals ck1 and ck3, the comparison circuit 1202 can output normal data in which the noise is removed.

Similarly, even when a noise is generated by a soft error at the falling edge of the signal on the clock terminal ck3, as long as a noise is not generated by a soft error at the falling edges of the signals on the clock terminals ck1 and ck2, the comparison circuit 1202 can output normal data in which the noise is removed.

Tenth Embodiment

Figure 17:
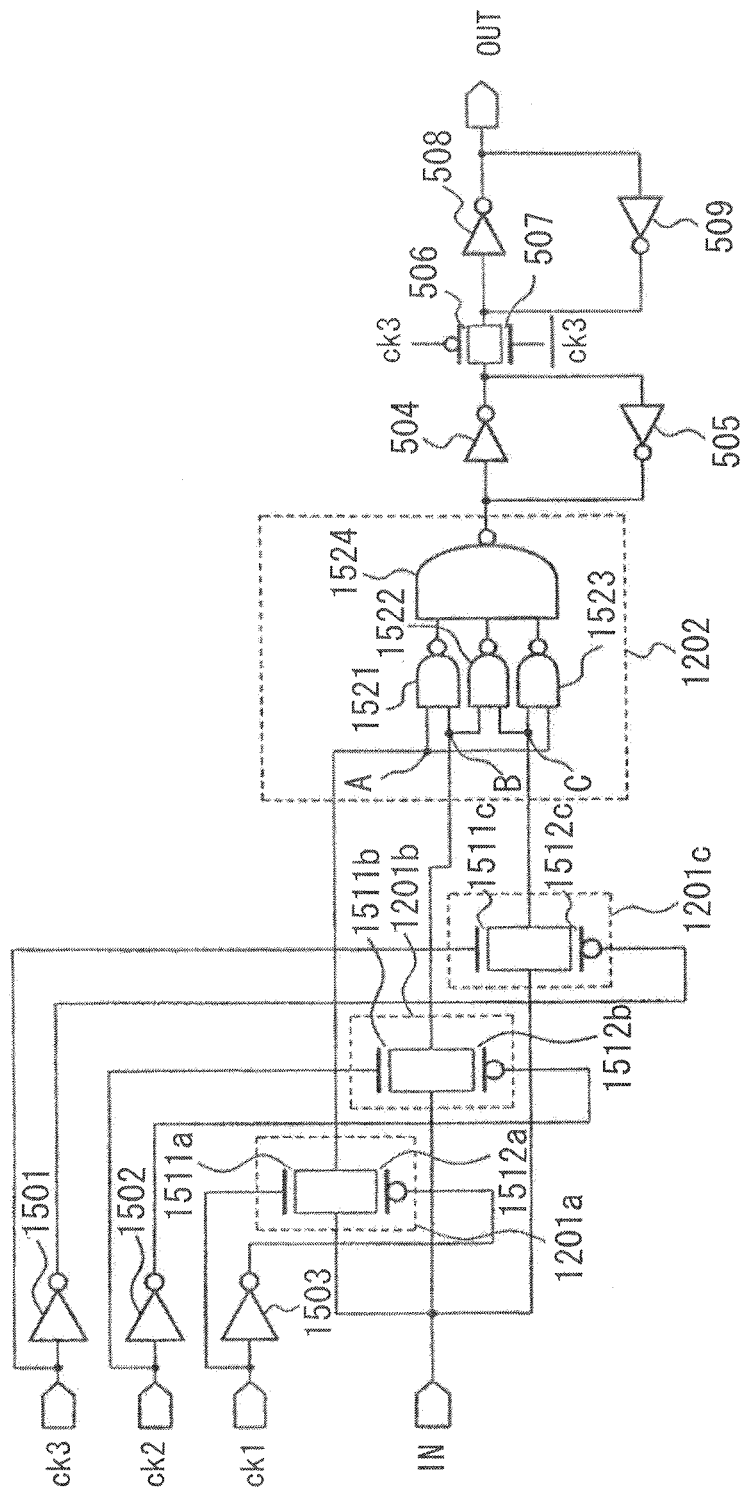
FIG. 17 is a circuit diagram showing an exemplary configuration of a data holding circuit according to a tenth embodiment of the present invention.

FIG. 17 is a circuit diagram showing an exemplary configuration of the data holding circuit according to a tenth embodiment of the present invention. The circuit in FIG. 17 is obtained when in the circuit in FIG. 15, the inverters 504, 505, 508 and 509 and the transistors 506 and 507 are provided in place of the data holding element 103. Similarly to the configuration of the circuit in FIG. 5, the inverters 504, 505, 508 and 509 and the transistors 506 and 507 are provided between the comparison circuit 1202 and the output terminal OUT. Here, the gate of the transistor 506 is connected to the clock terminal ck3, while the gate of the transistor 507 is connected to the inverted clock terminal /ck3. Clock signals inverted to each other are inputted to the clock terminal ck3 and the inverted clock terminal /ck3.

Figure 18:
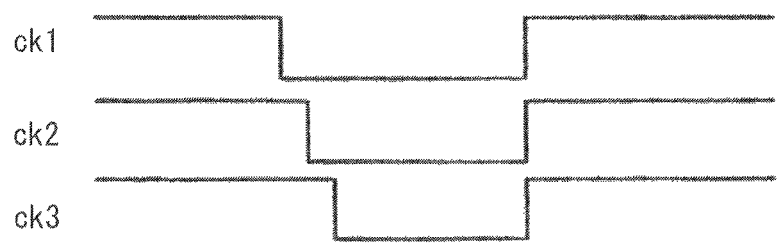
FIG. 18 is a timing chart showing exemplary operation of a data holding circuit of FIG. 17.

FIG. 18 is a timing chart showing exemplary operation of the data holding circuit in FIG. 17. The difference of the present embodiment from the ninth embodiment is described below. When all the three clock terminals ck1 to ck3 go into a low level, the comparison circuit 1202 outputs data corresponding to the data on the input terminals A to C so that the inverters 504 and 505 hold the output data of the comparison circuit 1202. At that time, the transistors 506 and 507 go ON, and hence the inverters 508 and 509 hold the output data of the inverter 504. The data held by the inverters 508 and 509 is outputted through the output terminal OUT.

After a predetermined period of time, the three clock terminals ck1 to ck3 simultaneously go into a high level. Thus, the three switches 1201a to 1201c go ON, while the transistors 506 and 507 go OFF. As a result, the circuit goes into a data holding mode, and hence the data hold by the inverters 508 and 509 is outputted through the output terminal OUT.

Eleventh Embodiment

FIGS. 19A to 19D are circuit diagrams showing exemplary configurations of the comparison circuits 102 according to the above-mentioned embodiments of the present invention. First, the exemplary configuration of a comparison circuit 102 shown in FIG. 19A is described below. In the p-channel transistor 1901, the source is connected to the power supply potential, while the gate is connected to the input terminal P2, and while the drain is connected to the source of the p-channel transistor 1902. In the p-channel transistor 1902, the gate is connected to the input terminal P1, while the drain is connected to the output terminal Q. In the n-channel transistor 1903, the drain is connected to the output terminal Q, while the gate is connected to the input terminal P1, and while the source is connected to the drain of the n-channel transistor 1904. In the n-channel transistor 1904, the gate is connected to the input terminal P2, while the source is connected to the reference potential.

Next, the exemplary configuration of a comparison circuit 102 shown in FIG. 19B is described below. The difference of the comparison circuit 102 in FIG. 19B from the comparison circuit 102 in FIG. 19A is described below. The gates of the transistors 1901 and 1903 are connected to the input terminal P1. The gates of the transistors 1902 and 1904 are connected to the input terminal P2.

Next, the exemplary configuration of a comparison circuit 102 shown in FIG. 19C is described below. In the p-channel transistor 1911, the source is connected to the power supply potential, while the gate is connected to the input terminal P1, and while the drain is connected to the node P3. In the n-channel transistor 1912, the drain is connected to the node P3, while the gate is connected to the input terminal P2, and while the source is connected to the reference potential. In the n-channel transistor 1913, the drain is connected to the node P3, while the gate is connected to the input terminal P1, and while the source is connected to the output terminal Q. In the p-channel transistor 1914, the source is connected to the node P3, while the gate is connected to the input terminal P2, and while the drain is connected to the output terminal Q.

Next, the exemplary configuration of a comparison circuit 102 shown in FIG. 19D is described below. In the inverter 1921, the input terminal is connected to the input terminal P1, while the output terminal is connected to the node P4, and while the input terminal of the inverter 1922 is connected to the node P3. In the n-channel transistor 1923, the drain is connected to the input terminal P2, while the gate is connected to the input terminal P1, and while the source is connected to the node P3. In the p-channel transistor 1924, the source is connected to the input terminal P2, while the gate is connected to the node P4, and while the drain is connected to the node P3. In the p-channel transistor 1925, the source is connected to the input terminal P1, while the gate is connected to the input terminal P2, and while the drain is connected to the node P3. In the n-channel transistor 1926, the drain is connected to the node P3, while the gate is connected to the input terminal P2, and while the source is connected to the node P4. In the p-channel transistor 1927, the source is connected to the input terminal P1, while the gate is connected to the node P3, and while the drain is connected to the output terminal Q. In the n-channel transistor 1928, the drain is connected to the input terminal P1, while the gate is connected to the output terminal of the inverter 1922, and while the source is connected to the output terminal Q.

Figure 20A:
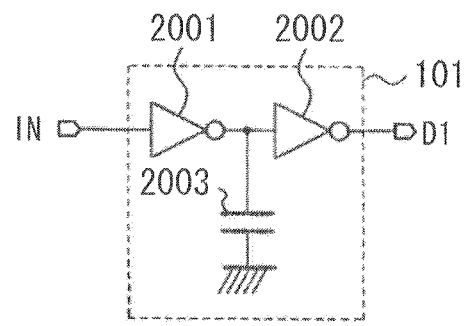
FIGS. 20A to 20C are circuit diagrams each showing an exemplary configuration of a delay element.
Figure 20B:
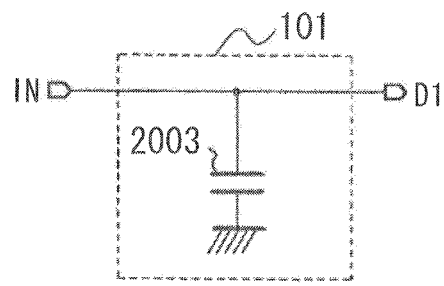
Figure 20C:
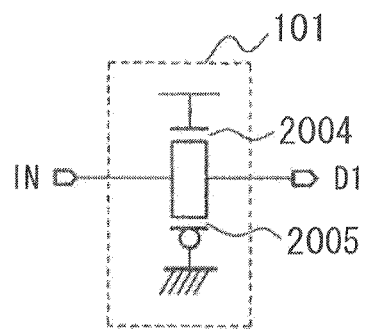

FIGS. 20A to 20C are circuit diagrams showing exemplary configurations of the delay elements 101 according to the above-mentioned embodiments. First, the exemplary configuration of a delay element 101 shown in FIG. 20A is described below. In the inverter 2001, the input terminal is connected to the input terminal IN, while the output terminal is connected to the input terminal of the inverter 2002. The output terminal of the inverter 2002 is connected to the node D1. The capacitor 2003 is connected between the output terminal of the inverter 2001 and the reference potential.

Next, the exemplary configuration of a delay element 101 shown in FIG. 203 is described below. The input terminal IN is connected to the node D1. The capacitor 2003 is connected between the input terminal IN and the reference potential.

Next, the exemplary configuration of a delay element 101 shown in FIG. 20C is described below. In the n-channel transistor 2004, the drain is connected to the input terminal IN, while the gate is connected to the power supply potential, and while the source is connected to the node D1. In the p-channel transistor 2005, the source is connected to the input terminal IN, while the gate is connected to the reference potential, and while the drain is connected to the node D1.

FIGS. 21A to 21I are circuit diagrams showing exemplary configurations of the data holding elements 103 according to the above-mentioned embodiments. First, the exemplary configuration of a data holding element 103 shown in FIG. 21A is described below. In the inverter 2101, the input terminal is connected to the output terminal OUT and the output terminal of the inverter 2102, while the output terminal is connected to the input terminal of the inverter 2102.

Next, the exemplary configuration of a data holding element 103 shown in FIG. 21B is described below. The capacitor 2103 is connected between the output terminal OUT and the reference potential.

Next, the exemplary configuration of a data holding element 103 shown in FIG. 21C is described below. In the p-channel transistor 2104, the source is connected to the power supply potential, while the gate is connected to the output terminal OUT, and while the drain is connected to the gate of the p-channel transistor 2106. In the n-channel transistor 2105, the drain is connected to the gate of the p-channel transistor 2106, while the gate is connected to the output terminal OUT, and while the source is connected to the reference potential. In the p-channel transistor 2106, the source is connected to the power supply potential, while the drain is connected to the output terminal OUT.

Next, the exemplary configuration of a data holding element 103 shown in FIG. 21D is described below. In the p-channel transistor 2107, the source is connected to the power supply potential, while the gate is connected to the output terminal OUT, and while the drain is connected to the gate of the n-channel transistor 2109. In the n-channel transistor 2108, the drain is connected to the gate of the n-channel transistor 2109, while the gate is connected to the output terminal OUT, and while the source is connected to the reference potential. In the n-channel transistor 2109, the drain is connected to the output terminal OUT, while the source is connected to the reference potential.

Next, the exemplary configuration of a data holding element 103 shown in FIG. 21E is described below. In the n-channel transistor 2110, the drain is connected to the power supply potential, while the gate is connected to the output terminal OUT, and while the source is connected to the output terminal OUT. In the p-channel transistor 2111, the source and the gate are connected to the output terminal OUT, while the drain is connected to the reference potential.

Next, the exemplary configuration of a data holding element 103 shown in FIG. 21F is described below. In the n-channel transistor 2112, the drain is connected to the gate of the p-channel transistor 2113, while the gate is connected to the output terminal OUT, and while the source is connected to the reference potential. In the p-channel transistor 2113, the source is connected to the power supply potential, while the drain is connected to the output terminal OUT.

Next, the exemplary configuration of a data holding element 103 shown in FIG. 21G is described below. In the p-channel transistor 2114, the source is connected to the power supply potential, while the gate is connected to the output terminal OUT, and while the drain is connected to the gate of the p-channel transistor 2115. In the p-channel transistor 2115, the source is connected to the power supply potential, while the drain is connected to the output terminal OUT.

Next, the exemplary configuration of a data holding element 103 shown in FIG. 21H is described below. In the p-channel transistor 2116, the source is connected to the power supply potential, while the gate is connected to the output terminal OUT, and while the drain is connected to the gate of the n-channel transistor 2117. In the n-channel transistor 2117, the drain is connected to the output terminal OUT, while the source is connected to the reference potential.

Next, the exemplary configuration of a data holding element 103 shown in FIG. 21I is described below. In the n-channel transistor 2118, the drain is connected to the gate of the n-channel transistor 2119, while the gate is connected to the output terminal OUT, and while the source is connected to the reference potential. In the n-channel transistor 2119, the drain is connected to the output terminal OUT, while the source is connected to the reference potential.

As described above, each of the data holding circuits according to the first to the eighth embodiments has: a first input terminal IN through which data is inputted; one or more delay elements 101 that delay the data inputted through the first input terminal IN; and a comparison and data holding element (a first element) that, when the data inputted through the first input terminal IN and the data delayed by the delay element 101 are equal to each other, holds data corresponding to the data inputted through the first input terminal IN and that, when the data inputted through the first input terminal IN and the data delayed by the delay element 101 are different from each other, continues to hold the data presently held by itself. The comparison and data holding element indicates the comparison circuit 102 and the data holding element 103 in FIG. 2 and the like, or alternatively the comparison and data holding element 610 in FIG. 6 and the like.

In the data holding circuit shown in FIG. 2 and the like, the comparison and data holding element has: a comparison circuit 102 that, when the data inputted through the first input terminal IN and the data delayed by the delay element 101 are equal to each other, outputs data corresponding to the data inputted through the first input terminal IN and that, when the data inputted through the first input terminal IN and the data delayed by the delay element 101 are different from each other, brings the output into a high impedance state; and a first data holding element 103 that holds the output data of the comparison circuit 102.

The data holding circuit in FIG. 5 and the like further has: second data holding elements 508 and 509 that hold the data outputted from the first data holding element 103 (504, 505); and clock switches 506 and 507 that are connected between the first and the second data holding elements and that perform ON/OFF operation in response to a clock signal CLK.

Further, in the data holding circuit in FIG. 5 and the like, the comparison circuit 102 has transistors 204 to 207, 502, and 503, and brings the output into a high impedance state in response to a clock signal CLK.

The data holding circuit in FIG. 9 and the like further has: a second input terminal SIN through which data is inputted; a first switch 802 connected between the first input terminal IN and the delay element 101; and a second switch 801 connected between the second input terminal SIN and the delay element 101. When the first switch 802 goes ON, the second switch 801 goes OFF and the comparison and data holding elements 102 and 103 receive the data inputted through the first input terminal IN and the data inputted through the first input terminal IN via the delay element 101. When the second switch 801 goes ON, the first switch 802 goes OFF and the comparison and data holding elements 102 and 103 receive the data inputted through the second input terminal SIN and the data inputted through the second input terminal SIN via the delay element 101.

The data holding circuit according to the ninth and the tenth embodiments has: a first input terminal IN through which data is inputted; a comparison circuit 1202 that outputs data corresponding to a large number of data pieces in the data provided on three or more input terminals A to C; three or more switches 1201a to 1201c that are connected between the first input terminal IN and the three or more input terminals A to C of the comparison circuit 1202 and that go from ON to OFF at mutually different timings; and a first data holding element 103 that holds the data outputted from the comparison circuit 1202.

The three or more input terminals A to C of the comparison circuit 1202 go into a floating state when the three or more switches 1201a to 1201c go OFF respectively.

The data holding circuit in FIG. 17 further has: second data holding elements 508 and 509 that hold the data outputted from the first data holding element 103 (504, 505); and clock switches 506 and 507 that are connected between the first and the second data holding elements and that perform ON/OFF operation in response to a clock signal ck3.

The clock switches 506 and 507 perform ON/OFF operation reverse to that of one switch 1201c among the three or more switches 1201a to 1201c.

The clock switches 506 and 507 perform ON/OFF operation reverse to that of one switch 1201c that goes from ON to OFF at the latest timing among the three or more switches 1201a to 1201c.

Even when a noise caused by a soft error is inputted, the noise can be removed so that normal data can be outputted. This prevents a soft error and hence improves reliability.

Here, all the above-mentioned embodiments merely show examples of implementation of the present invention, and hence should not be regarded as limiting the technical scope of the present invention. That is, the present invention may be implemented in various forms without departing from the technical spirit and the major features of the present invention.

What is claimed is:

1. A data holding circuit comprising:
a first input terminal through which data is inputted;
a comparison circuit having at least three input terminals for outputting data corresponding to a large number of data pieces in data provided on the at least three input terminals;
at least three switches connected between said first input terminal and the at least three input terminals of said comparison circuit, the at least three switches going from an ON state to an OFF state at mutually different timings; and
a first data holding element for holding data outputted from said comparison circuit.

2. The data holding circuit according to claim 1, wherein the at least three input terminals of said comparison circuit go into a floating state when said at least three switches enter an OFF state, respectively.

3. The data holding circuit according to claim 1, further comprising: a second data holding element for holding data outputted from said first data holding element; and
a clock switch connected between said first and said second data holding elements and for performing an ON/OFF operation in response to a clock signal.

4. The data holding circuit according to claim 3, wherein said clock switch performs an ON/OFF operation opposite to the operation of one switch of said at least three switches.

5. The data holding circuit according to claim 4, wherein said clock switch performs an ON/OFF operation opposite to the operation of one switch going from the ON state to the OFF state at the latest timing among said three or more switches.

* * * * *